(12) United States Patent
Li

(10) Patent No.: US 10,496,866 B2
(45) Date of Patent: Dec. 3, 2019

(54) DEVICE AND METHOD FOR CAPACITIVE SENSING IDENTIFICATION SYSTEM

(71) Applicant: Chipone Technology (Beijing) Co., Ltd., Beijing (CN)

(72) Inventor: Zhuo Li, Beijing (CN)

(73) Assignee: CHIPONE TECHNOLOGY (BEIJING) CO., LTD., Beijing (CN)

( * ) Notice: Subject to any disclaimer, the term of this patent is extended or adjusted under 35 U.S.C. 154(b) by 186 days.

(21) Appl. No.: 15/749,263

(22) PCT Filed: Dec. 27, 2016

(86) PCT No.: PCT/CN2016/112377
§ 371 (c)(1),
(2) Date: Jan. 31, 2018

(87) PCT Pub. No.: WO2010/032683
PCT Pub. Date: Feb. 22, 2018

(65) Prior Publication Data
US 2019/0050617 A1    Feb. 14, 2019

(30) Foreign Application Priority Data
Aug. 16, 2016   (CN) .......................... 2016 1 0677526

(51) Int. Cl.
*G06K 9/00* (2006.01)
*G06F 3/041* (2006.01)
(Continued)

(52) U.S. Cl.
CPC .......... *G06K 9/0002* (2013.01); *G05F 1/461* (2013.01); *G06F 3/044* (2013.01); *G06F 3/0416* (2013.01);
(Continued)

(58) Field of Classification Search
CPC combination set(s) only.
See application file for complete search history.

(56) References Cited

U.S. PATENT DOCUMENTS

2005/0073324 A1* 4/2005 Umeda ............. G01R 27/2605
324/662
2010/0060562 A1    3/2010 Hadwen et al.
(Continued)

FOREIGN PATENT DOCUMENTS

CN    101589477 A    11/2009
CN    104217193 A    12/2014
(Continued)

OTHER PUBLICATIONS

First Office Action from Chinese Patent Application No. 201610677526.2, dated Jun. 13, 2017, 10 pages.

*Primary Examiner* — Alex Kok S Liew
(74) *Attorney, Agent, or Firm* — Westman, Champlin & Koehler, P.A.

(57) ABSTRACT

Disclosed a device and a method for a capacitive sensing identification system. The device comprises: an amplifier module having a first input terminal, a second input terminal and an output terminal; an exciting signal source configured to provide an exciting signal to the first input terminal of the amplifier module through a sensing capacitor of the capacitive sensing identification system; a front-end feedback capacitor being connected between the first input terminal and the output terminal of the amplifier module; and a compensation module being connected between the second input terminal and the output terminal of the amplifier module and configured to provide an input difference voltage to the second input terminal of the amplifier module, receive an output voltage from the output terminal of the amplifier module, and adjust the input difference voltage provided to the second input terminal of the amplifier
(Continued)

module in accordance with a background capacitance of the capacitive sensing identification system when the output voltage provided by the output terminal of the amplifier module is not within a predetermined range. The background capacitance is compensated using feedback mechanism, which can effectively adjust the effective dynamitic range of the capacitive sensing identification system.

19 Claims, 4 Drawing Sheets

(51) Int. Cl.
| | | |
|---|---|---|
| *G06F 3/044* | (2006.01) | |
| *G05F 1/46* | (2006.01) | |
| *H03K 17/96* | (2006.01) | |
| *H03M 1/46* | (2006.01) | |
| *H03M 1/12* | (2006.01) | |

(52) U.S. Cl.
CPC ......... *G06F 3/0418* (2013.01); *H03K 17/962* (2013.01); *H03M 1/466* (2013.01); *H03K 2217/94026* (2013.01); *H03M 1/1295* (2013.01)

(56) References Cited

U.S. PATENT DOCUMENTS

| | | | |
|---|---|---|---|
| 2018/0025198 A1* | 1/2018 | Li | G06K 9/0002 340/5.53 |
| 2018/0150177 A1* | 5/2018 | Hwang | G06F 3/0416 |

FOREIGN PATENT DOCUMENTS

| | | |
|---|---|---|
| CN | 104748770 A | 7/2015 |
| CN | 105352593 A | 2/2016 |
| CN | 105447438 A | 3/2016 |
| TW | 201629844 A | 8/2016 |

\* cited by examiner

DEVICE AND METHOD FOR CAPACITIVE SENSING IDENTIFICATION SYSTEM

CROSS-REFERENCE TO RELATED APPLICATION

This application is a Section 371 National Stage Application of International Application No. PCT/CN2016/112377, filed Dec. 27, 2016, which is not yet published, and claims priority to the Chinese Patent Application No. 201610677526.2, filed on Aug. 16, 2016, entitled "device and method for capacitive sensing identification system", which are incorporated herein by reference in their entirety.

BACKGROUND OF THE DISCLOSURE

Field of the Disclosure

The present disclosure relates to a device and a method for a capacitive sensing identification system, and more particularly, to a device and a method for adjusting a dynamic range of a capacitive sensing identification system.

Background of the Disclosure

Currently, a capacitive sensing identification system is widely used in human-computer interaction applications such as a projected capacitive touchscreen, a touch panel and a fingerprint identification system, the principal of the capacitive sensing identification system is to convert a capacitance value into an electrical signal (for example, voltage, current, etc.) through a front-end detection circuit. For a touchscreen application, finger pressure causes changes of capacitance values of sensing capacitors located at corresponding positions, and electrical signals output by the front-end detection circuit become different from those output by the front-end detection circuit when there is no touch, and accordingly, whether and where a touch occurs can be determined. For a capacitive fingerprint identification sensor, a valley and a ridge of a fingerprint form different capacitance with the sensor, and the corresponding detected electrical signals output by the front-end detection circuit are different, either.

When there is no touch, an inherent capacitance, which is called a background capacitance in the disclosure, exists in the capacitive sensing identification system. When a touch occurs, the capacitance values of the sensing capacitors change correspondingly on basis of the inherent capacitance. From the above principal, the effective dynamic range of the capacitive sensing identification system is the change amount of the detected capacitance. For the touchscreen application, the effective dynamic range is the difference between the capacitance values output before and after a touch occurs. However, for the fingerprint identification system, the effective dynamic range is the difference between the capacitance values of the capacitors formed by the valley and ridge of the fingerprint. Increasing the gain of the front-end detection circuit can increase the effective dynamic range of the system.

In some applications, the front-end detection circuit sequentially detects the capacitance values in different states, that is, respectively detects the background capacitance and the sensing capacitance introduced after a touch occurs, and then a subsequent processing circuit or program perform difference treatment.

In other applications, the front-end detection circuit detects the capacitance values in different conditions at the same time, that is, the background capacitance and the sensing capacitance introduced after a touch occurs are detected at the same time.

For example, the background capacitance is assumed to be $C_b$, the change amount of the capacitance value to be detected is assumed to be $C_\Delta$, and the front-end detection circuit converts the capacitance value into a voltage value following a conversion relation which can be simply expressed as the following equation (1), $$VOUT = A^*(C_b + C_\Delta) \qquad (1).$$

Because the amplitude of the signal output by the front-end detection circuit is limited, that is, $VOUT \leq V_{h\_limit}$, the maximum value of the conversion gain A of the front-end detection circuit satisfies the following equation (2), $$A_{max} = \frac{V_{h\_limit}}{C_b + C_\Delta} \qquad (2)$$

It can be seen that because of the background capacitance, the front-end detection circuit cannot directly amplify the change amount of the detected capacitance, and only increasing the gain of the front-end detection circuit will saturate the front-end detection circuit. When the change amount of the detected capacitance is relatively small compared with the absolute value of the detected capacitance, as a typical result, the effective dynamic range of the system will be decreased and the front-end detection circuit cannot effectively increase the input signal of the system by increasing the gain.

Therefore, a new device and a new method for adjusting the dynamic range of the capacitive sensing identification system are desired.

SUMMARY OF THE DISCLOSURE

In view of this, an embodiment of the disclosure is to provide a device and a method for a capacitive sensing identification system, for effectively adjusting the dynamic range of the capacitive sensing identification system.

According to a first aspect, there is provided a device for the capacitive sensing identification system, comprising:

an amplifier module having a first input terminal, a second input terminal and an output terminal;

an exciting signal source configured to provide an exciting signal to the first input terminal of the amplifier module through a sensing capacitor of the capacitive sensing identification system;

a front-end feedback capacitor being connected between the first input terminal and the output terminal of the amplifier module; and a compensation module being connected between the second input terminal and the output terminal of the amplifier module and configured to provide an input difference voltage to the second input terminal of the amplifier module, receive an output voltage from the output terminal of the amplifier module, and adjust the input difference voltage provided to the second input terminal of the amplifier module in accordance with a background capacitance of the capacitive sensing identification system when the output voltage provided by the output terminal of the amplifier module is not within a predetermined range.

In some embodiments, the compensation module comprises:

an analog-to-digital converter being connected with the output terminal of the amplifier module;

a digital-to-analog converter being connected with the second input terminal of the amplifier module; and a digital control unit being connected between the analog-to-digital converter and the digital-to-analog converter, and configured to provide the input difference voltage to the second input terminal of the amplifier module through the digital-to-analog converter, receive the output voltage from the output terminal of the amplifier module through the analog-to-digital converter, and adjust the input difference voltage provided to the second input terminal of the amplifier module in accordance with the background capacitance when the received output voltage is not within the predetermined range.

In some embodiments, the compensation module is further configured to adjust a capacitance of the front-end feedback capacitor while adjusting the input difference voltage provided to the second input terminal of the amplifier module.

In some embodiments, the step of adjusting the input difference voltage provided to the second input terminal of the amplifier module is performed in a background capacitance quantization process.

In some embodiments, the device for the capacitive sensing identification system further comprises: a reset switch being connected with the front-end feedback capacitor in parallel, and configured to control the amplifier module to output the input difference voltage when performing a reset.

In some embodiments, the capacitive sensing identification system is used for a fingerprint identification device, and during the background capacitance quantization process, a capacitance between a valley of a fingerprint and a touch surface of the fingerprint identification device is quantified as the background capacitance.

In some embodiments, the capacitive sensing identification system is used for a touchscreen, and during the background capacitance quantization process, a coupled capacitance obtained from a touch surface of the touch panel when the touch surface of the touch panel is not touched, is qualified as the background capacitance.

In some embodiments, the input difference voltage is a difference between an input reference voltage and an offset voltage of the system.

In some embodiments, the first input terminal is a negative input terminal and the second input terminal is a positive input terminal.

In some embodiments, the first input terminal is a positive input terminal and the second input terminal is a negative input terminal.

According to a second aspect, there is provided a method for a capacitive sensing identification system, comprising:

providing an exciting signal to a first input terminal of an amplifier module through a sensing capacitor of the capacitive sensing identification system, and providing an input difference voltage to a second input terminal of the amplifier module, wherein a front-end feedback capacitor is connected between the first input terminal and an output terminal of the amplifier module;

receiving an output voltage from the output terminal of the amplifier module; and adjusting the input difference voltage provided to the second input terminal of the amplifier module in accordance with a background capacitance of the capacitive sensing identification system when the output voltage provided by the output terminal of the amplifier module is not within a predetermined range.

In some embodiments, the method for the capacitive sensing identification system further comprises: performing digital-to-analog conversion before the input difference voltage is provided to the second input terminal of the amplifier module, and performing analog-to-digital conversion after the output voltage is received from the output terminal of the amplifier module.

In some embodiments, the step of adjusting an input difference voltage provided to the second input terminal of the amplifier module in accordance with the background capacitance of the capacitive sensing identification system when the output voltage provided by the output terminal of the amplifier module is not within a predetermined range comprises:

adjusting the input difference voltage provided to the second input terminal of the amplifier module in accordance with the background capacitance when a minimum value of the output voltage provided by the output terminal of the amplifier module is not within the predetermined range.

In some embodiments, the method for the capacitive sensing identification system further comprises: adjusting a capacitance of the front-end feedback capacitor while the input difference voltage provided to the second input terminal of the amplifier module is being adjusted.

In some embodiments, the step of adjusting a capacitance of the front-end feedback capacitor while the input difference voltage provided to the second input terminal of the amplifier module is being adjusted comprises:

adjusting the input difference voltage provided to the second input terminal of the amplifier module in accordance with the background capacitance and correspondingly adjusting the capacitance of the front-end feedback capacitor, when a maximum value of the output voltage provided by the output terminal of the amplifier module is not within the predetermined range.

In some embodiments, the step of adjusting the input difference voltage provided to the second input terminal of the amplifier module is performed in a background capacitance quantization process.

In some embodiments, the input difference voltage is a difference between an input reference voltage and an offset voltage of the system.

In some embodiments, the first input terminal is a negative input terminal and the second input terminal is a positive input terminal.

In some embodiments, the first input terminal is a positive input terminal and the second input terminal is a negative input terminal.

BRIEF DESCRIPTION OF THE DRAWINGS

To describe the technical solution in the embodiments of the present disclosure more clearly, the following briefly introduces the accompanying drawings in the embodiments. Apparently, the accompanying drawings in the following description relate to only some embodiments of the present disclosure, and are not for limiting the present disclosure.

DETAILED DESCRIPTION OF THE DISCLOSURE

In order to make the objective, technical schemes and advantages of the present disclosure more clear, the following will describe the technical schemes of the embodiments of the present disclosure clearly and completely in conjunction with the accompanying drawings of the embodiments of the present disclosure. Apparently, the embodiments to be described are only some embodiments of the disclosure, not all the embodiments of the disclosure. All of other embodiments, which are obtained by one skilled in the art from the embodiments described hereinbelow without the need for creative work, will fall within the scope of the present disclosure.

Figure 1:
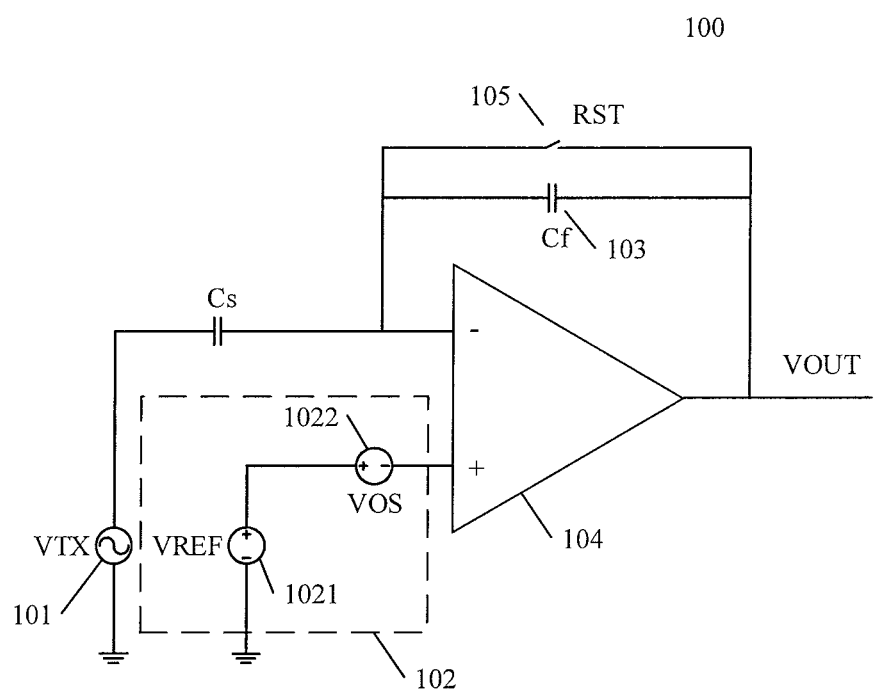
FIG. 1 is a structural diagram of an example device for a capacitive sensing identification system.

FIG. 1 is a structural diagram of an example device 100 for a capacitive sensing identification system.

As shown in FIG. 1, the device 100 includes a first signal source 101, a second signal source 102, a front-end feedback capacitor 103 and an amplifier module 104. In some embodiments, the front-end feedback capacitor 103 is connected with a reset switch 105 in parallel.

The first signal source 101 is used to provide an exciting signal VTX, the exciting signal VTX is transferred to a first input terminal of the amplifier module 104 through a sensing capacitor Cs of the capacitive sensing identification system. The second signal source 102 includes an input reference voltage source 1021 and an offset voltage source 1022 of the system which are connected in series to a second input terminal of the amplifier module 104, the input reference voltage source 1021 and the offset voltage source 1022 of the system are connected reversely with each other, for providing a difference between the input reference voltage VREF and the offset voltage VOS of the system to the amplifier module 104. The front-end feedback capacitor 103 is connected between the first input terminal and the output terminal of the amplifier module 104 and has a front-end feedback capacitance $C_f$. In the embodiment, the first input terminal of the amplifier module can be a negative input terminal and the second input terminal can be a positive input terminal. In some embodiments, the first input terminal of the amplifier module can be a positive input terminal and the second input terminal can be a negative input terminal.

Figure 2:
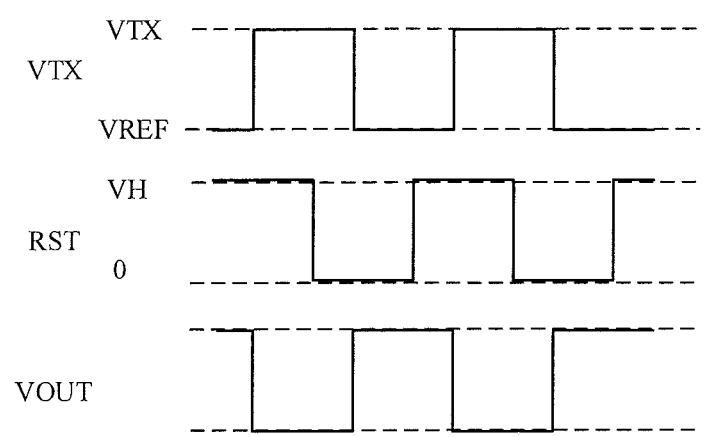
FIG. 2 is a signal timing diagram of an example device for the capacitive sensing identification system.

FIG. 2 is a signal timing diagram of an example device for the capacitive sensing identification system.

As shown in FIG. 2, VREF is an input reference voltage, VOS is an offset voltage of the system, VTX is an exciting signal, and in the embodiment, the exciting signal is a square-wave signal, of which a low level voltage is VREF and a high level voltage is VTX; RST is a control signal for the reset switch. Cs is the sensing capacitor and $C_f$ is the front-end feedback capacitance. The front-end detection circuit is reset when the signal RST is at high level, the output voltage VOUT of the amplifier module is an input difference voltage VREF-VOS. When the signal RST is at low level, the front-end detection circuit transfers charges when the exciting signal VTX changes, so that, the output voltage VOUT changes.

The principal of the embodiment of the present disclosure is illustrated as follow by referring to FIG. 1 and FIG. 2.

Specifically, at first, the offset voltage VOS of the system is assumed to be zero, the charges across the two capacitors satisfy the following equation (3) when the control signal RST is at high level, $$(VTX-VREF)*C_s \tag{3}$$

The exciting signal VTX changes from high level to low level, the charges across the two capacitors are redistributed, the charges across the two capacitors satisfy the following equation (4), $$(VREF-VREF)*C_s+(VOUT-VREF)*C_f \tag{4}$$

According to the principal of charge conservation, the output voltage VOUT can be calculated by the following equation (5), $$VOUT = VREF + \frac{C_s}{C_f}(VTX - VREF) \tag{5}$$

If a condition that the offset voltage VOS of the system is non-zero is taken into consideration, the following equation (6) can be obtained, $$VOUT = VREF + \frac{C_s}{C_f}(VTX - VREF) - VOS \tag{6}$$

For the capacitive sensing identification system, the background capacitance is assumed to be $C_b$, the change amount of the detected capacitance is assumed to be $C_\Delta$, the equation (6) can be modified as the equation (7), $$VOUT = VREF + \frac{C_b + C_\Delta}{C_f}(VTX - VREF) - VOS \tag{7}$$

It can be understood from the equation (7) that because of the presence of the background capacitance $C_b$, in order to avoid the saturation of the front-end detection circuit, the feedback capacitance $C_f$ must be sufficiently large so that the change amount of the front-end output voltage caused by the change amount $C_\Delta$ of the capacitance can be reduced.

For this, in the equation (7), if $$\frac{C_b}{C_f}(VTX - VREF) = VOS, \tag{8}$$

the effect of the background capacitance $C_b$ is completely canceled out.

Further, if the following equation (9) is satisfied, $$\frac{C_b}{C_f}(VTX - VREF) - VOS = -VREF \tag{9}$$

It can be understood that the system provides the output voltage VOUT equal to zero when there's only the background capacitance existing in the system, and the output voltage VOUT satisfies the following equation (10) after the change amount $C_\Delta$ of the capacitance is introduced due to touch, $$VOUT = \frac{C_\Delta}{C_f}(VTX - VREF) \qquad (10)$$

It can be understood from the equation (10) that, by using the feedback capacitance $C_f$ with a relatively small value, the front-end gain can be increased and further the dynamic range of the system can be expanded.

In view of the above principal, the disclosure provides a device and a method for the capacitive sensing identification system, which can effectively adjust the dynamic range of the capacitive sensing identification system in accordance with the background capacitance by using feedback mechanism.

Figure 3:
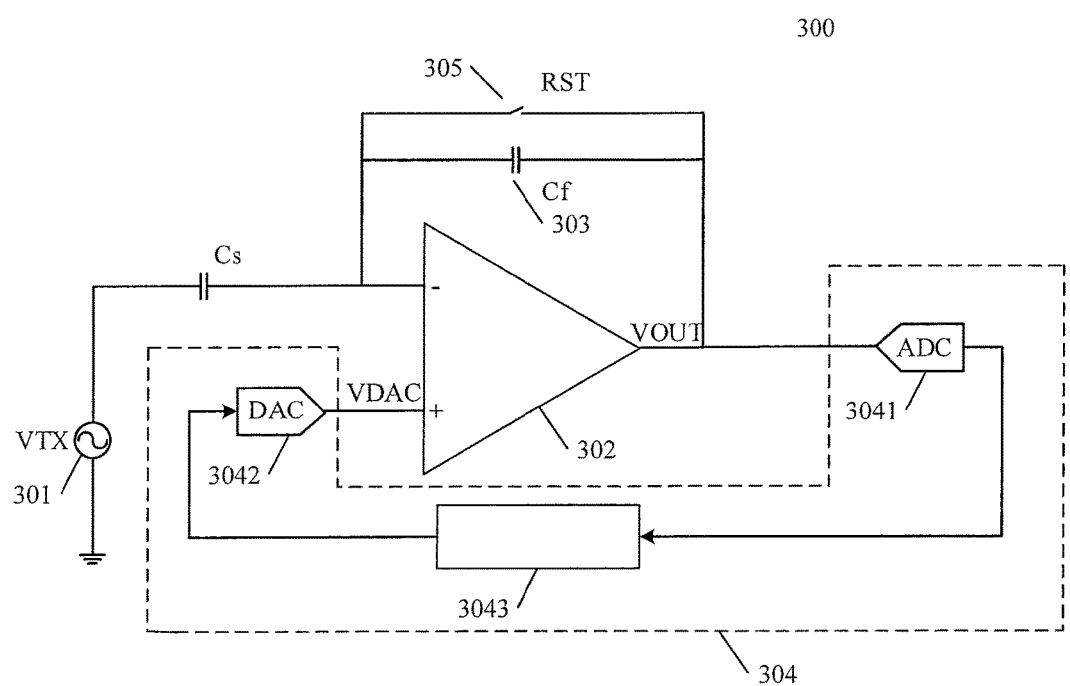
FIG. 3 is a structural diagram of an example device for the capacitive sensing identification system according to an embodiment of the present disclosure.

FIG. 3 is a structural diagram of an example device 300 for the capacitive sensing identification system according to an embodiment of the present disclosure. As shown in FIG. 3, the device 300 includes an exciting signal source 301, an amplifier module 302, a front-end feedback capacitor 303 and a compensation module 304. In some embodiments, the device 300 further includes a reset switch 305.

The amplifier module 302 has a first input terminal, a second input terminal and an output terminal. For example, the amplifier module 302 can be an ordinary differential amplifier, the first input terminal of the differential amplifier can be a negative input terminal, the second input terminal of the differential amplifier can be a positive input terminal; or vice versa.

The exciting signal source 301 provides an exciting signal VTX to the negative input terminal of the amplifier module 302 through the sensing capacitor Cs of the capacitive sensing identification system. The sensing capacitor Cs can be a sensing capacitor on the touch board, and touching on the touch board results in a change of the capacitance value of the sensing capacitor Cs.

The front-end feedback capacitor 303 is connected between the negative input terminal and the output terminal of the amplifier module 302. The front-end feedback capacitor 303 can provide the feedback capacitance $C_f$.

The compensation module 304 is connected between the positive input terminal and the output terminal of the amplifier module 302. The compensation module 304 provides an input difference voltage VDAC to the positive input terminal of the amplifier module 302, wherein VDAC is the difference VREF−VOS between the input reference voltage VREF and the offset voltage VOS of the system; receives the output voltage VOUT from the output terminal of the amplifier module 302, and adjusts the input difference voltage VDAC provided to the positive input terminal of the amplifier module in accordance with the background capacitance when the output voltage VOUT provided by the output terminal of the amplifier module 302 is not within a predetermined range.

In some embodiments, the compensation module 304 can include an analog-to-digital converter ADC3041, a digital-to-analog converter DAC3042 and a digital control unit 3043. The analog-to-digital ADC3041 is connected with the output terminal of the amplifier module 302, the digital-to-analog converter DAC3042 is connected with the positive input terminal of the amplifier module 302, and the digital control unit 3043 is connected between the analog-to-digital converter ADC3041 and the digital-to-analog converter DAC3042.

The digital control unit 3043 is used to provide the input difference voltage VDAC to the positive input terminal of the amplifier module through the digital-to-analog converter DAC3042, to receive the output voltage VOUT from the output terminal of the amplifier module through the analog-to-digital converter ADC3041, and to adjust the input difference voltage VDAC provided to the positive input terminal of the amplifier module in accordance with the background capacitance when the received output voltage VOUT is not within the predetermined range. For example, the input difference voltage VDAC can be set to satisfy the equation (9). Under this condition, although the output voltage VOUT should satisfy the above equation (10) theoretically, the output voltage VOUT may still not be included within the desired range under actual condition, so that the input voltage difference VDAC may be fine-adjusted, for example, it can be progressively increased or decreased by a certain value, by this way, finally, the output voltage VOUT is adjusted to be within the desired range.

In some embodiments, the digital control unit 3043 further adjusts the capacitance $C_f$ of the front-end feedback capacitor while the input difference voltage VDAC provided to the positive input terminal of the amplifier module 302 is being adjusted. For example, after the minimum value of the output voltage VOUT is controlled to be within the predetermined range by adjusting the input difference voltage VDAC, the front-end feedback capacitance $C_f$ can be adjusted to control the maximum value of the output voltage VOUT to be within the predetermined range while the input difference voltage VDAC is being adjusted. For example, according to the equation (10), the output voltage VOUT can be increased by decreasing the front-end feedback capacitance. As an example, the input difference voltage VDAC and the capacitance $C_f$ of the front-end feedback capacitor can be adjusted by a same proportion. As another example, the input difference voltage VDAC and the capacitance $C_f$ of the front-end feedback capacitor can be adjusted by different proportions. The adjustment of the capacitance $C_f$ of the front-end feedback capacitor can be implemented in various manners, for example, it can be implemented through a capacitor array and a switch selection method, which is not described here.

In some embodiments, the adjustment of the input difference voltage VDAC can be performed during the background capacitance quantization process. For example, the compensation for the background capacitance can be performed during a finger-touch process and the sensing capacitance quantization process. The quantization of the background capacitance can be implemented in various ways. For example, for fingerprint identification, the sensing capacitance is zero when no touch occurs, after a finger touches a surface of a sensor, the capacitance formed between the valley of the fingerprint and the sensor is different from the capacitance formed between the ridge of the fingerprint and the sensor, so that, the capacitance formed between the ridge of the fingerprint and the surface of the fingerprint identification device can be quantified as the background capacitance. In another embodiment, for a touchscreen, a coupled capacitance of the touch surface of the touchscreen formed when no touch occurs can be quantified as the background capacitance. Those skilled in the art can understand that for other applications, the quantification of the background capacitance may be implemented in a variety of other ways.

The reset switch 305 is connected with the front-end feedback capacitor 303 in parallel and configured to control the amplifier module 302 to output the input difference voltage VREF-VOS when a reset is performed. As an example, the device 300 is reset when the signal RST is at high level, the output voltage VOUT of the amplifier module is equal to the input difference voltage VREF-VOS. When the signal RST is at low level, the device 300 transfers charges when the exciting signal VTX changes, so that, the output voltage VOUT changes.

Figure 4:
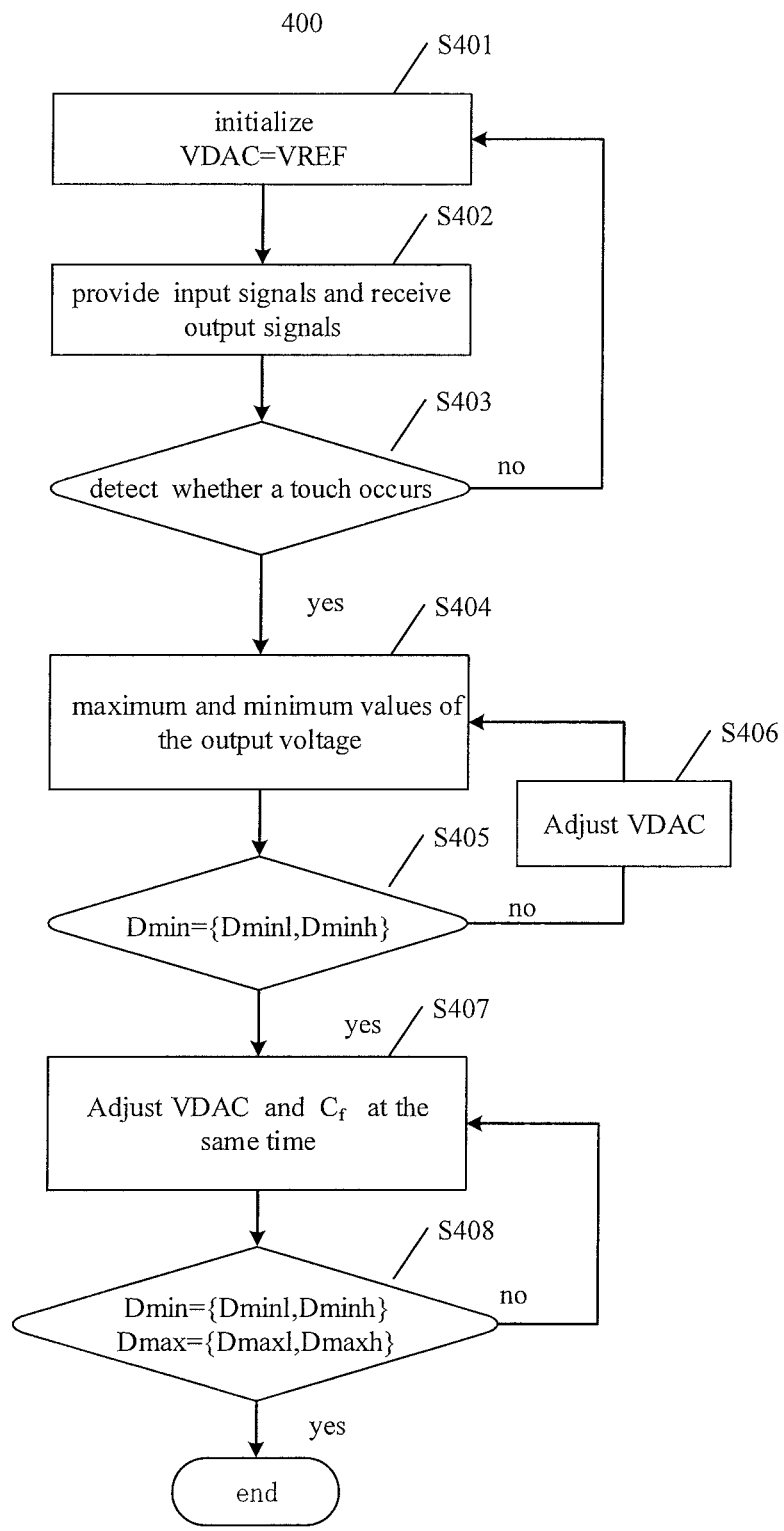
FIG. 4 is a flow diagram of an example method for the capacitive sensing identification system according to an embodiment of the present disclosure.

FIG. 4 is a flow diagram of an example method 400 for the capacitive sensing identification system according to an embodiment of the present disclosure. The method 400 can be executed in the above device 300.

At step S401, initialization is performed. For example, the input difference voltage VDAC provided to the amplifier module can be initialized to be equal to the input reference voltage VREF.

At step S402, the exciting signal is provided to the first input terminal of the amplifier module, the input difference voltage is provided to the second input terminal of the amplifier module, and the output voltage is received from the output terminal of the amplifier module.

At step S403, whether a touch occurs is detected, if a touch occurs, the step S403 is performed, otherwise, the step S401 is performed. For example, the change of the sensing capacitor Cs can be obtained in accordance with the output voltage of the amplifier module, so that, whether a touch occurs can be determined. The step can be executed either by the digital control unit of the above device 300 or by an external control unit.

At step S404, if the touch occurs, the maximum and minimum values of the output voltage can be calculated.

For example, the maximum value Dmax, the minimum value Dmin of the output voltages and their distributions corresponding to a collected image can be obtained.

At step S405, whether the minimum value of the output voltage is within a desired range is determined, if not, the step S406 is performed, if yes, the step S407 is performed. For example, it can be determined whether the minimum value is within the range {Dminl, Dminh} or not, wherein Dminl is a lower limit value of the minimum value, and Dminh is an upper limit value of the minimum value.

At step S406, the input difference voltage VDAC provided to the positive input terminal of the amplifier module is adjusted in accordance with the background capacitance, and then the S404 is performed. For example, the input difference voltage VDAC is set to satisfy the equation (9), then the input difference voltage VDAC is fine-adjusted, for example, it is progressively increased or decreased by a certain value, by the way, finally the output voltage VOUT is adjusted to be within the desired range.

At step S407, the capacitance $C_f$ of the front-end feedback capacitor is adjusted and the input difference voltage VDAC is adjusted correspondingly, so that, the maximum value of the output voltage VOUT is controlled to be within the desired range. For example, according to the equation (10), the output voltage VOUT can be increased by decreasing the capacitance of the front-end feedback capacitance, so that, the maximum value Dmax is controlled to be within the range {Dmaxl, Dmaxh}, wherein the Dmaxl is a lower limit value of the maximum value, and Dmaxh is an upper limit value of the maximum value. As an example, the input difference voltage VDAC and the capacitance $C_f$ of the front-end feedback capacitor can be adjusted by a same proportion. As another example, the input difference voltage VDAC and the capacitance $C_f$ of the front-end feedback capacitor can be adjusted by different proportions.

At step S408, whether the above minimum and maximum values are within the desired range is determined. If the above minimum and maximum values are not within the desired range, the step S405 is performed, and if the above minimum and maximum values are within the desired range, the process completes.

The above-described adjustment for the input difference voltage VDAC can be performed during the background capacitance quantization process. For example, the compensation for the background capacitance can be performed during a finger-touch process and the sensing capacitance quantization process. The quantization of the background capacitance can be implemented in various ways. For example, for fingerprint identification, the sensing capacitance is zero when no touch occurs, after a finger touches a surface of a sensor, the capacitance formed between the valley of the fingerprint and the sensor is different from the capacitance formed between the ridge of the fingerprint and the sensor, so that, the capacitance of the capacitor formed between the ridge of the fingerprint and the surface of the fingerprint identification device can be quantified as the background capacitance. In another embodiment, for a touchscreen, a coupled capacitance of touch surface of the touchscreen when no touch occurs can be quantified as the background capacitance. Those skilled in the art can understand that for other applications, the quantification of the background capacitance may be implemented in a variety of other ways.

The embodiments of the disclosure can be combined with other mechanism for adjusting the effective dynamitic range. For example, after the compensation for the background capacitance is performed preferentially according to the method described in the embodiments of the disclosure, the dynamic adjustment mechanisms such as increasing the gain of ADC may be performed subsequently.

In the embodiments of the disclosure, by using feedback mechanism, the input signal of the amplifier module can be adjusted in accordance with the background capacitance of the capacitive sensing identification system, so that, the effect on the output signal caused by the background capacitance can be compensated. Accordingly, the dynamitic range of the capacitive sensing identification system can be effectively adjusted and further the change amount of the sensing capacitance can be detected effectively.

The embodiments of the disclosure can either compensate the background capacitance only by adjusting the input difference voltage VDAC, or compensate the background capacitance by adjusting both of the front-end feedback capacitance $C_f$ and the input difference voltage VDAC at the same time, wherein the front-end feedback capacitance $C_f$ and the input difference voltage VDAC can be adjusted by a same proportion or different proportions and the adjustment manner is flexible and in high precision.

The embodiments of the disclosure can be applied to various capacitive sensing identification systems, for example, the dynamic range of the output signal can be effectively controlled in the applications for fingerprint identification and touch control.

The foregoing descriptions are merely exemplary embodiments of the present disclosure, but are not intended to limit the protection scope of the present disclosure. The protection scope of the present disclosure is determined by the appended claims.

The invention claimed is:

1. A device for a capacitive sensing identification system, comprising:
   an amplifier module having a first input terminal, a second input terminal and an output terminal;
   an exciting signal source configured to provide an exciting signal to said first input terminal of said amplifier module through a sensing capacitor of said capacitive sensing identification system;

a front-end feedback capacitor being connected between said first input terminal and said output terminal of said amplifier module; and a compensation module being connected between said second input terminal and said output terminal of said amplifier module and configured to provide an input difference voltage to said second input terminal of said amplifier module, receive an output voltage from said output terminal of said amplifier module, and adjust said input difference voltage provided to said second input terminal of said amplifier module in accordance with a background capacitance of said capacitive sensing identification system when said output voltage provided by said output terminal of said amplifier module is not within a predetermined range.

2. The device according to claim 1, wherein said compensation module comprises:

an analog-to-digital converter being connected with said output terminal of said amplifier module;

a digital-to-analog converter being connected with said second input terminal of said amplifier module; and a digital control unit being connected between said analog-to-digital converter and said digital-to-analog converter, and configured to provide said input difference voltage to said second input terminal of said amplifier module through said digital-to-analog converter, receive said output voltage from said output terminal of said amplifier module through said analog-to-digital converter, and adjust said input difference voltage provided to said second input terminal of said amplifier module in accordance with said background capacitance when said received output voltage is not within said predetermined range.

3. The device according to claim 1, wherein said compensation module is further configured to adjust a capacitance of said front-end feedback capacitor while adjusting said input difference voltage provided to said second input terminal of said amplifier module.

4. The device according to claim 1, wherein said step of adjusting said input difference voltage provided to said second input terminal of said amplifier module is performed in a background capacitance quantization process.

5. The device according to claim 4, further comprising: a reset switch being connected with said front-end feedback capacitor in parallel and configured to control said amplifier module to output said input difference voltage when performing a reset.

6. The device according to claim 5, wherein said capacitive sensing identification system is used for a fingerprint identification device, and during said background capacitance quantization process, a capacitance between a valley of a fingerprint and a touch surface of said fingerprint identification device is quantified as said background capacitance.

7. The device according to claim 5, wherein said capacitive sensing identification system is used for a touchscreen and during said background capacitance quantization process, a coupled capacitance obtained from a touch panel when a touch surface of said touch panel is not touched, is quantified as said background capacitance.

8. The device according to claim 1, wherein said input difference voltage is a difference between an input reference voltage and an offset voltage of said system.

9. The device according to claim 1, wherein said first input terminal is a negative input terminal and said second input terminal is a positive input terminal.

10. The device according to claim 1, wherein said first input terminal is a positive input terminal and said second input terminal is a negative input terminal.

11. A method for a capacitive sensing identification system, comprising:

providing an exciting signal to a first input terminal of an amplifier module through a sensing capacitor of said capacitive sensing identification system, and providing an input difference voltage to a second input terminal of said amplifier module, wherein a front-end feedback capacitor is connected between said first input terminal and an output terminal of said amplifier module;

receiving an output voltage from said output terminal of said amplifier module; and adjusting an input difference voltage provided to said second input terminal of said amplifier module in accordance with a background capacitance of said capacitive sensing identification system when said output voltage provided by said output terminal of said amplifier module is not within a predetermined range.

12. The method according to claim 11, further comprising: performing digital-to-analog conversion before said input difference voltage is provided to said second input terminal of said amplifier module, and performing analog-to-digital conversion after said output voltage is received from said output terminal of said amplifier module.

13. The method according to claim 11, wherein said step of adjusting said input difference voltage provided to said second input terminal of said amplifier module in accordance with said background capacitance of said capacitive sensing identification system when said output voltage provided by said output terminal of said amplifier module is not within said predetermined range comprises:

adjusting said input difference voltage provided to said second input terminal of said amplifier module in accordance with said background capacitance when a minimum value of said output voltage provided by said output terminal of said amplifier module is not within said predetermined range.

14. The method according to claim 11, further comprising: adjusting a capacitance of said front-end feedback capacitor while said input difference voltage provided to said second input terminal of said amplifier module is being adjusted.

15. The method according to claim 14, wherein said step of adjusting said capacitance of said front-end feedback capacitor while said input difference voltage provided to said second input terminal of said amplifier module is being adjusted comprises:

adjusting said input difference voltage provided to said second input terminal of said amplifier module in accordance with said background capacitance and correspondingly adjusting said capacitance of said front-end feedback capacitor, when a maximum value of said output voltage provided by said output terminal of said amplifier module is not within said predetermined range.

16. The method according to claim 11, wherein said step of adjusting said input difference voltage provided to said second input terminal of said amplifier module is performed in a background capacitance quantization process.

17. The method according to claim 11, wherein said input difference voltage is a difference between an input reference voltage and an offset voltage of said system.

18. The method according to claim 11, wherein said first input terminal is a negative input terminal and said second input terminal is a positive input terminal.

19. The method according to claim 11, wherein said first input terminal is a positive input terminal and said second input terminal is a negative input terminal.

\* \* \* \* \*